US011158966B2

(12) United States Patent
Gingrich, III

(10) Patent No.: US 11,158,966 B2
(45) Date of Patent: Oct. 26, 2021

(54) COLLAPSABLE ALIGNMENT MEMBER

(71) Applicant: TE Connectivity Services GmbH, Schaffhausen (CH)

(72) Inventor: Charles Raymond Gingrich, III, Mechanicsburg, PA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 0 days.

(21) Appl. No.: 16/831,247

(22) Filed: Mar. 26, 2020

(65) Prior Publication Data
US 2021/0305730 A1 Sep. 30, 2021

(51) Int. Cl.
H01R 12/70 (2011.01)
H01R 12/73 (2011.01)

(52) U.S. Cl.
CPC ....... H01R 12/7005 (2013.01); H01R 12/737 (2013.01)

(58) Field of Classification Search
CPC .. H01R 13/631; H01R 13/645; H01R 13/6453; H01R 12/737; H01R 12/7005
USPC .......................... 439/378, 680, 681, 374, 700
See application file for complete search history.

(56) References Cited

U.S. PATENT DOCUMENTS

| | | | | |
|---|---|---|---|---|
| 3,116,959 A * | 1/1964 | Abodeely | ............ | H05K 7/1454 439/378 |
| 3,951,500 A * | 4/1976 | Anderson | ............ | H01R 13/631 439/248 |
| 4,508,405 A * | 4/1985 | Damon | ................ | H05K 7/1069 324/754.08 |
| 4,700,743 A * | 10/1987 | L'Henaff | ................ | F16L 37/32 137/560 |
| 5,092,774 A * | 3/1992 | Milan | ................... | H01R 13/658 439/66 |
| 5,730,605 A * | 3/1998 | Glusker | ............... | H05K 7/1454 439/289 |
| 6,007,364 A * | 12/1999 | Wu | ..................... | H01R 12/7005 439/101 |
| 6,146,210 A * | 11/2000 | Cha | ..................... | H01R 13/2421 439/680 |
| 6,464,511 B1 * | 10/2002 | Watanabe | .......... | H01R 13/2421 439/66 |
| 6,880,239 B1 * | 4/2005 | Jennings | ............... | H01R 43/205 29/729 |
| 7,607,930 B1 * | 10/2009 | Wu | ...................... | H01R 13/745 439/247 |

(Continued)

Primary Examiner — Abdullah A Riyami
Assistant Examiner — Marcus E Harcum

(57) ABSTRACT

An alignment member for aligning electrical components. The alignment member includes a base, a telescoping portion and a spring. The base has a first spring receiving cavity which extends from a first end of the base to a spring engaging shoulder. The telescoping portion has a second spring receiving cavity with a spring cooperating surface. The spring is positioned in the first spring receiving cavity of the base and in the second spring receiving cavity of the telescoping portion. The spring has a length which is approximately equal to or slightly larger than the length of a cavity formed by the spring receiving cavity and the base receiving cavity when the alignment member is in an extended position. The spring is retained in a biased position to keep the telescoping portion extended until a force is applied to the telescoping portion by the mating alignment member.

11 Claims, 7 Drawing Sheets

(56) References Cited

U.S. PATENT DOCUMENTS

| | | | | |
|---|---|---|---|---|
| 7,789,719 B1* | 9/2010 | Yin | H01R 13/2421 | 439/824 |
| 7,857,669 B1* | 12/2010 | Wavering | H01R 13/6315 | 439/700 |
| 7,878,834 B2* | 2/2011 | Sherman | H05K 3/325 | 439/324 |
| 8,179,681 B2* | 5/2012 | Aoki | H05K 3/301 | 361/741 |
| 8,287,318 B1* | 10/2012 | Walters | H01R 13/533 | 439/700 |
| 8,360,796 B2* | 1/2013 | Daubigney | H01R 13/635 | 439/345 |
| 8,636,527 B2* | 1/2014 | Hengel | H01R 13/6315 | 439/141 |
| 9,160,450 B2* | 10/2015 | Duis | G02B 6/4246 | |
| 9,282,669 B2* | 3/2016 | Yan | H05K 7/14 | |
| 10,038,262 B1* | 7/2018 | Behziz | H01R 12/7082 | |
| 10,103,462 B1* | 10/2018 | Herring | H01R 12/7005 | |
| 10,136,196 B2* | 11/2018 | Ritter | H04Q 1/15 | |
| 10,224,652 B2* | 3/2019 | Herring | H01R 12/737 | |
| 2006/0030196 A1* | 2/2006 | Sasame | H01R 12/7005 | 439/378 |
| 2006/0079113 A1* | 4/2006 | Minich | H01R 12/52 | 439/378 |
| 2007/0037434 A1* | 2/2007 | Fedder | H01R 12/7005 | 439/378 |
| 2010/0195302 A1* | 8/2010 | Rigby | H05K 3/366 | 361/784 |
| 2010/0311268 A1* | 12/2010 | Nguyen | H01R 12/7005 | 439/378 |
| 2011/0008992 A1* | 1/2011 | Alguera Gallego | B62D 53/125 | 439/378 |
| 2011/0256753 A1* | 10/2011 | Gulla | H01R 12/91 | 439/378 |
| 2015/0340808 A1* | 11/2015 | Chen | H01R 13/6315 | 439/378 |
| 2015/0380867 A1* | 12/2015 | Simpson | H01R 9/035 | 439/378 |
| 2016/0294081 A1* | 10/2016 | Tsang | H01R 13/645 | |
| 2016/0380376 A1* | 12/2016 | Singer | H01R 13/18 | 439/346 |
| 2019/0176298 A1* | 6/2019 | Woodman, III | B25B 13/10 | |

* cited by examiner

COLLAPSABLE ALIGNMENT MEMBER

FIELD OF THE INVENTION

The present invention is directed to alignment members used to align electrical components. In particular, the invention is directed to guideposts and/or guidepost receptacles which collapse as components are mated together.

BACKGROUND OF THE INVENTION

Guideposts and guidepost receptacles are often used to pre-align mating components, such as connectors used in rack mounted systems where there is a backplane and a daughtercard. The guideposts and guidepost receptacles help prevent the stubbing of the contacts when the daughtercard is positioned on the backplane. However, as shown in FIG. 14, known guideposts 202 and guidepost receptacles 204 are limited in height, as the guideposts 202 must be positioned in openings 206 of the guidepost receptacles 204 of the of the daughtercard 208 as the daughtercard 208 is moved into electrical engagement with the backplane 210. Consequently, the guideposts 202 and guidepost receptacles 204 have a limited reach and a limited ability to properly align the connector and mating connector, as shown in FIG. 14.

It would, therefore, be beneficial to provide guideposts and/or guidepost receptacles with an extended reach to allow for proper alignment of the daughtercard to the backplane, thereby further preventing stubbing of the contacts.

SUMMARY OF THE INVENTION

An object is to provide guideposts and/or guidepost receptacles with an extended reach.

An object is to provide guideposts and/or guidepost receptacles which have resilient components to allow the guideposts and/or guidepost receptacles to compress or collapse when mated.

An embodiment is directed to an alignment member for aligning a first electrical component to a second electrical component. The alignment member includes a base, a telescoping portion and a spring. The base has a first spring receiving cavity which extends from a first end of the base to a spring engaging shoulder. The telescoping portion has a second spring receiving cavity with a spring cooperating surface. The spring is positioned in the first spring receiving cavity of the base and in the second spring receiving cavity of the telescoping portion. The spring has a length which is approximately equal to or slightly larger than the length of a cavity formed by the spring receiving cavity and the base receiving cavity when the alignment member is in an extended position. Prior to mating with a mating alignment member, the spring is retained in a biased position to keep the telescoping portion extended until a force is applied to the telescoping portion by the mating alignment member.

An embodiment is directed to an alignment member for aligning a first electrical component to a second electrical component, the alignment member includes a base having a tip receiving section. The tip receiving section has a spring receiving cavity which extends from a first end of the base to a spring engaging shoulder. A telescoping tip portion has a closed end and an open end. A base receiving cavity extends from the open end to proximate the closed end, a spring cooperating surface provided proximate the closed end. A spring positioned in the spring receiving cavity of the tip receiving section of the base and in the base receiving cavity of the telescoping tip portion. The spring has a length which is approximately equal to or slightly larger than the length of a cavity formed by the spring receiving cavity and the base receiving cavity when the alignment member is in an extended position. Prior to mating with a mating alignment member, the spring is retained in a biased position to keep the tip portion extended until a force is applied to the tip portion by the mating alignment member.

An embodiment is directed to an alignment member for aligning a first electrical component to a second electrical component, the alignment member includes a base which has a telescoping receptacle portion receiving cavity which extends from a first end of the base to proximate a second end of the base. A telescoping receptacle portion has a guidepost receiving opening which extends from proximate a first end of the telescoping receptacle portion toward a second end of the telescoping receptacle portion. A spring is positioned in the telescoping receptacle portion receiving cavity of the base and in the guidepost receiving opening of the telescoping receptacle portion. The spring has a length which is approximately equal to or slightly larger than the length of a cavity formed by the telescoping receptacle portion receiving cavity and the guidepost receiving opening when the alignment member is in an extended position. Prior to mating with a mating alignment member, the spring is retained in a biased position to keep the telescoping receptacle portion extended until a force is applied to the telescoping receptacle portion by the mating alignment member.

Other features and advantages of the present invention will be apparent from the following more detailed description of the illustrative embodiment, taken in conjunction with the accompanying drawings which illustrate, by way of example, the principles of the invention.

DETAILED DESCRIPTION OF THE INVENTION

Figure 1:
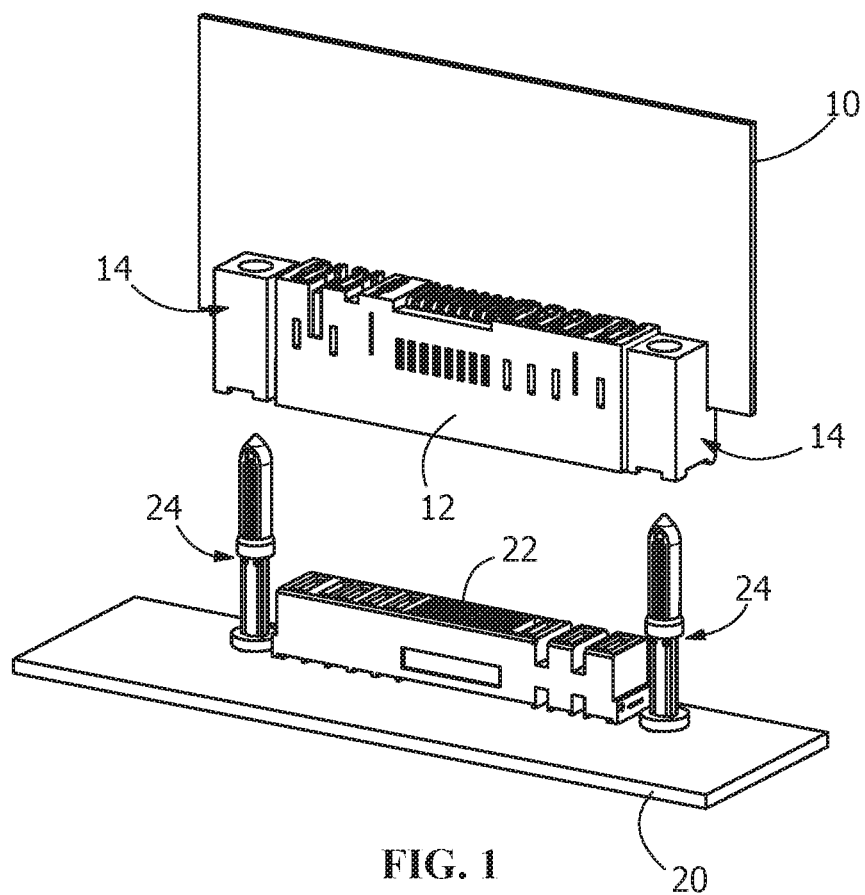
FIG. 1 is a perspective view of an illustrative mating connector mounted on a daughtercard prior to mating with an illustrative connector mounted on a backplane, guideposts extending from the backplane are shown in an extended position.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise.

Moreover, the features and benefits of the invention are illustrated by reference to the preferred embodiments. Accordingly, the invention expressly should not be limited to such embodiments illustrating some possible non-limiting combination of features that may exist alone or in other combinations of features, the scope of the invention being defined by the claims appended hereto.

As shown in FIG. 1, a first substrate or daughtercard 10 has a daughtercard connector 12 and first alignment members or guidepost receptacles 14 mounted thereon. A second substrate or backplane 20 has a backplane connector 22 and second alignment members or guideposts 24 mounted thereon. The daughtercard 10 and backplane 20 are shown prior to being placed in electrical engagement in FIG. 1. The daughtercard 10 and backplane 20 are shown in electrical engagement in FIG. 2. While the illustrative embodiment shows the alignment members 14, 24 used to align substrates 10, 20, the alignment members 14, 24 may be used to align electrical connectors or other electrical components.

Figure 3:
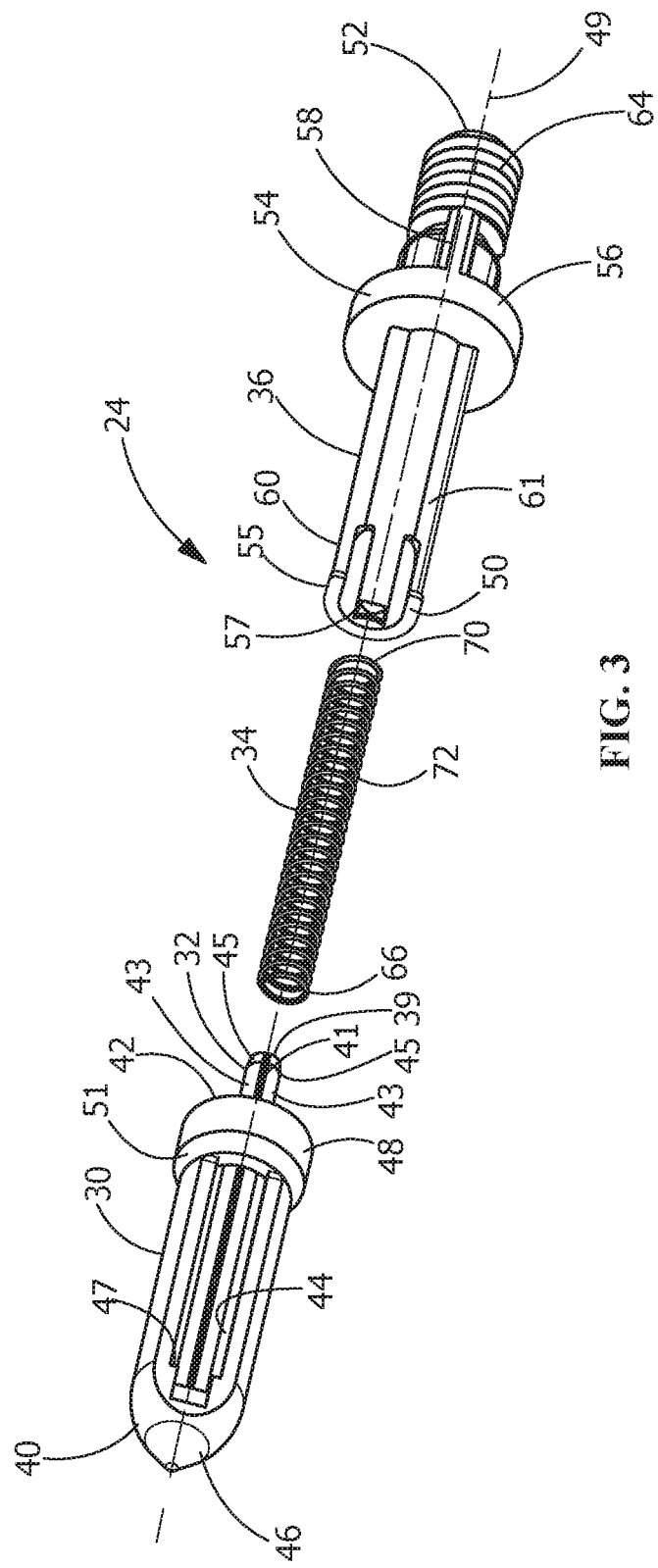
FIG. 3 is an exploded perspective view of an illustrative guidepost according the to the invention.
Figure 4:
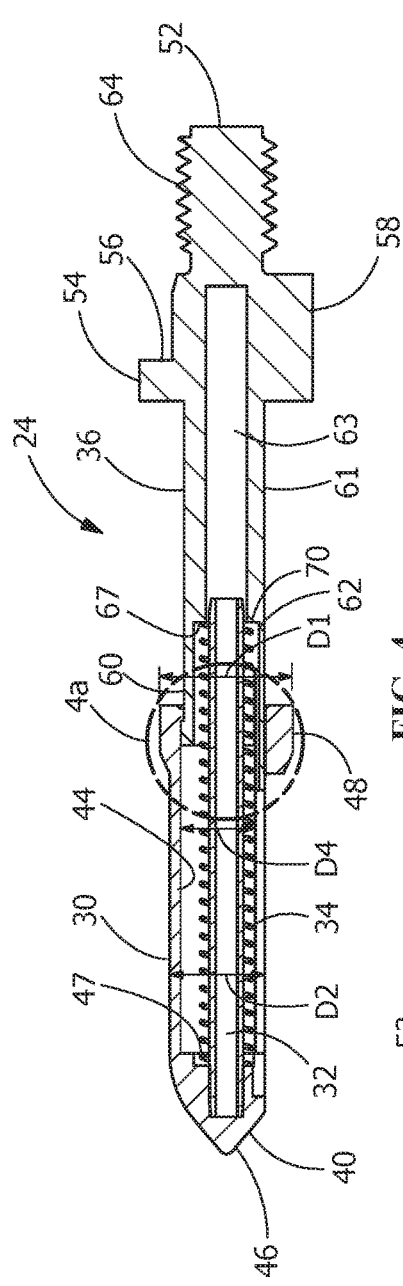
FIG. 4 is a cross-sectional view of the guidepost of FIG. 3 with a guidepost receptacle positioned thereon, the guidepost is shown in the extended position. In this position, the daughtercard is not fully mated to the backplane.
Figure 4A:
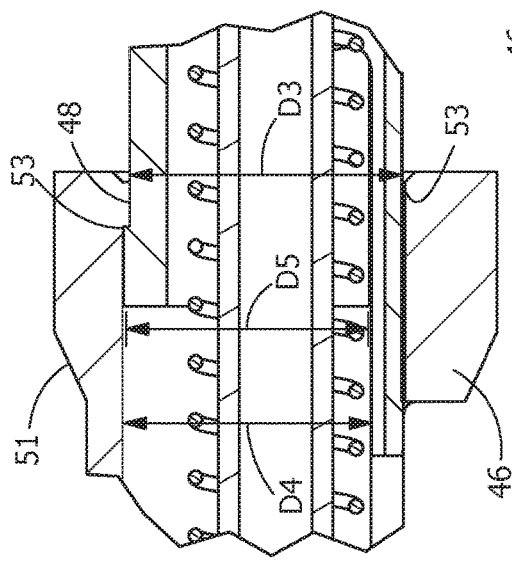
FIG. 4a is an enlarged view of the section 4a of FIG. 4.
Figure 5:
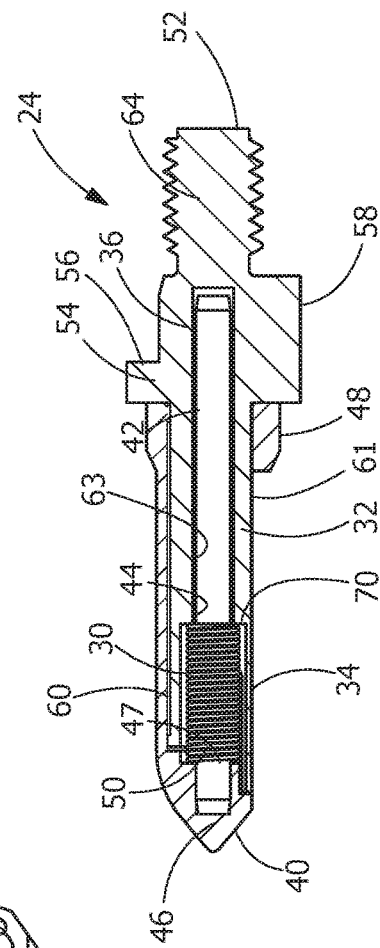
FIG. 5 is a cross-sectional view of the guidepost of FIG. 3 with a guidepost receptacle positioned thereon, the guidepost is shown in the retracted position. In this position, the daughtercard is fully mated to the backplane.

As shown in FIGS. 3-5, each of the guideposts 24 has a telescoping tip portion 30, a center pin guide 32, a coil spring 34 and a base 36. The telescoping tip portion 30 has a closed end 40 and an open end 42. A base receiving cavity 44, which is also a spring receiving cavity, extends from the open end 42 to proximate the closed end 40. The closed end 40 has a rounded outer surface 46 which acts as a lead-in surface when mating with the guidepost receptacle 14. A spring cooperating surface 47 is provide proximate the closed end 40 at the end of the base receiving cavity 44. An enlarged portion 48 is positioned proximate the open end 42. The enlarged portion 48 extends about the circumference of the telescoping tip portion 30. The enlarged portion 48 has an outside diameter D1, which is larger than the outside diameter D2 of the telescoping tip portion 30 and an inside diameter D3, which is smaller than the inside diameter D4 of the base receiving cavity 44. The enlarged portion 48 has an outside shoulder 51 and an inside shoulder 53.

The center pin guide 32 extends from proximate the closed end 40 past the open end 42. The center pin guide 32 extends along a longitudinal axis 49 of the guidepost 24 and is centered in the base receiving cavity 44. The center pin guide 32 is a cylindrical member. The center pin guide 32 has slots 41 which extend along the length thereof. The slots 41 form movable, resilient arms 43. In various embodiments, the arms 43 have retention shoulders 45 provided proximate free ends 47 thereof.

The base 36 has a first end 50 and an oppositely facing second end 52. A shoulder 55 is provided proximate the first end 50. The shoulder 55 extends about the circumference of the base 36. The shoulder 55 has an outside diameter D5, which is larger than the inside diameter D3 of the enlarged portion 48. A backplane positioning member 54 is provided between the first end 50 and the second end 52. The backplane positioning member 54 is in the form of a disc with a backplane cooperating surface 56. Projections 58 extend from the backplane cooperating surface 56 in a direction toward the second end 52. The projections 58 are dimensioned to engage through holes (not shown) in the backplane 20 to retain the guideposts 24 in position on the backplane 20. A tip receiving section 60 extends from the backplane positioning member 54 to the first end 50. The tip receiving section 60 has a spring receiving cavity 62 which extends from the first end 50 to a spring engaging shoulder 67. A mounting hardware section 64 extends from the backplane positioning member 54 to the second end 52.

A post receiving member 61 is positioned in the spring receiving cavity 62 and extends from proximate the first end 50 to proximate the backplane positioning member 54. The post receiving member 61 has a longitudinally extending opening 63 which is configured to receive the center guide pin 32 therein. A circumferentially extending shoulder 65 is provided in the opening 63.

The coil spring 34 is dimensioned to be received in the spring receiving cavity 62 of the tip receiving section 60 of the base 36 and in the base receiving cavity 44 of the telescoping tip portion 30. The spring 34 is dimensioned to have a length which is approximately equal to or slightly larger than the length of the cavity formed by the spring receiving cavity 62 and the base receiving cavity 44 when the guidepost 24 is in the extended position, as shown in FIG. 4. The spring 34 is retained in position between the spring engaging shoulder 67 and the spring cooperating surface 47.

In the extended position, shown in FIG. 4, the spring 34 is in the spring receiving cavity 62 and the base receiving cavity 44. A first end 66 of the spring 34 is in engagement with the spring cooperating surface 47 of the tip portion 30 and a second end 70 of the spring 34 is in engagement with the spring engaging shoulder 67 of the base 36. In this position, the spring is slightly biased to keep the tip portion 30 extended until a force is applied to the tip portion 30. The center pin guide 32 is positioned in the longitudinally extending center opening 72 of the spring 34 to properly center the spring 34 in the spring receiving cavity 62 and the base receiving cavity 44.

In the extended position, a portion of the telescoping tip portion 30 proximate the open end 42 is positioned over a portion of the first end 50 of the base 36, such that the first end 50 of the tip receiving section 60 of the base 36 is positioned in the base receiving cavity 44. In this position, the inside shoulder 53 of the enlarged portion 48 engages the shoulder 55 of the base 36 to prevent the removal of the telescoping tip portion 30 from the base 36. In addition to, or alternatively, the retention shoulders 45 of the resilient arms 43 engages the shoulder 57 of the tip receiving section 60 to prevent the removal of the telescoping tip portion 30 from the base 36.

In the retracted or compressed position, shown in FIG. 5, the first end 66 of the spring 34 remains in engagement with the spring cooperating surface 47 of the tip portion 30 and a second end 70 of the spring 34 is in engagement with the spring engaging shoulder 67 of the base 36. In this position, the spring is compressed and exerts a biasing force on the tip portion 30.

In the retracted or compressed position, a majority of the telescoping tip portion 30 is positioned over tip receiving section 60 of the first end 50 of the base 36, such that the entire tip receiving section 60 of the base 36 is positioned in the base receiving cavity 44 and the entire center pin guide 32 is positioned in the post receiving member 63.

Figure 11:
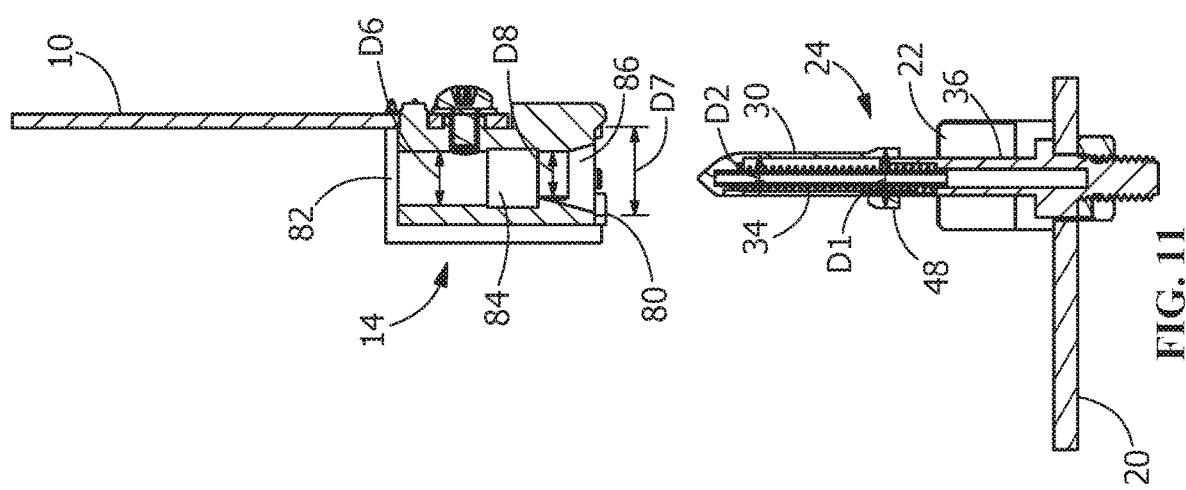
FIG. 11 is a cross-section view of the guidepost of FIG. 1 cooperating with the guidepost receptacle as the daughtercard is being inserted onto the backplane.

As shown in FIG. 11, the guidepost receptacle 14 has a first end 80 and a second end 82. A guidepost receiving opening 84 extends from proximate the first end 80 toward the second end 82. The guidepost receiving opening 84 has an inside diameter D6 which is greater than the outside diameter D2 of the telescoping tip portion 30 but smaller than the outside diameter D1 of the enlarged portion 48. A tapered lead-in opening 86 extends from the first end 80 to the guidepost receiving opening 84. The inside diameter D7 of the tapered lead-in opening 86 at the first end 80 is larger than the outside diameter D1 of the enlarged portion 48, while the inside diameter D8 of the tapered lead-in opening 86 at the guidepost receiving opening 84 is the same as the inside diameter D6 of the guidepost receiving opening 84.

Figure 12:
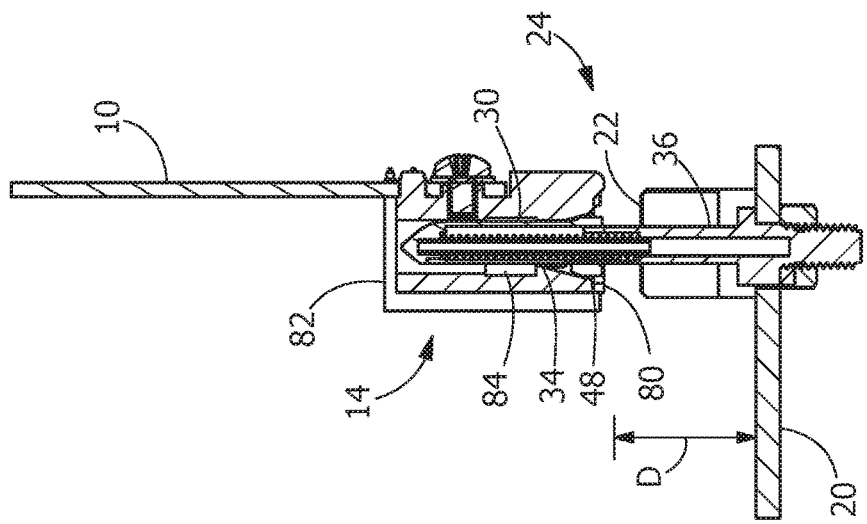
FIG. 12 is a cross-section view of the guidepost cooperating with the guidepost receptacle as the daughtercard is being inserted onto the backplane.
Figure 14:
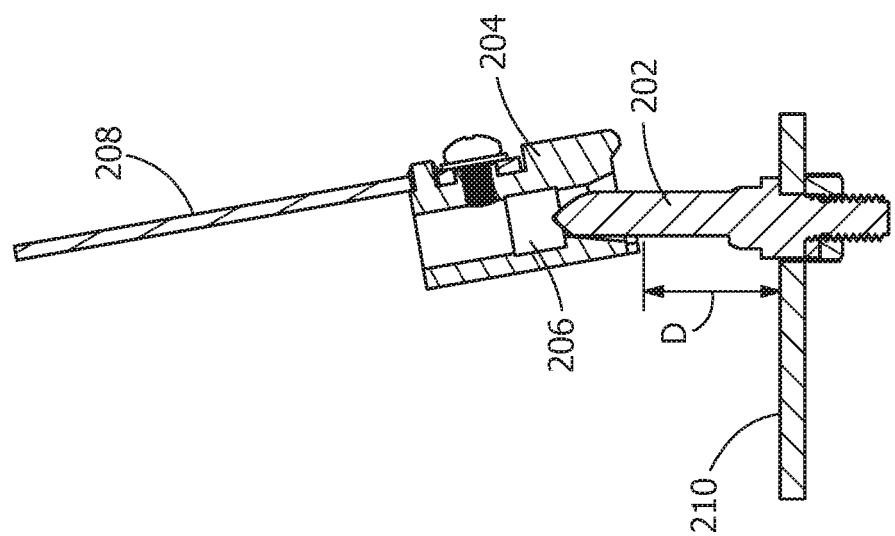
FIG. 14 is a cross-section view of the prior art showing a known guidepost cooperating with a known guidepost receptacle as the daughtercard is being inserted onto the backplane.

In use, the daughtercard 10 and the guidepost receptacles 14 are moved into position relative to the backplane 20 and the guideposts 24. As the daughtercard 10 is mated to the backplane 20, the telescoping tip portions 30 of the guideposts 24 are moved into the guidepost receiving openings 84 of the guidepost receptacles 14, as shown in FIG. 12. The positioning of the telescoping tip portions 30 in the guidepost receiving openings 84 pulls the daughtercard 10 into more precise alignment with the backplane 20 at a further distance D from the backplane 22 (FIG. 12) than known guideposts (FIG. 14). The alignment allows the daughtercard connector 12 and the backplane connector 22 to be properly aligned, thereby facilitating mating of the daughtercard connector 12 to the backplane connector 22 and minimizing stubbing and damage to the connectors and the contacts housed in the connectors.

Figure 2:
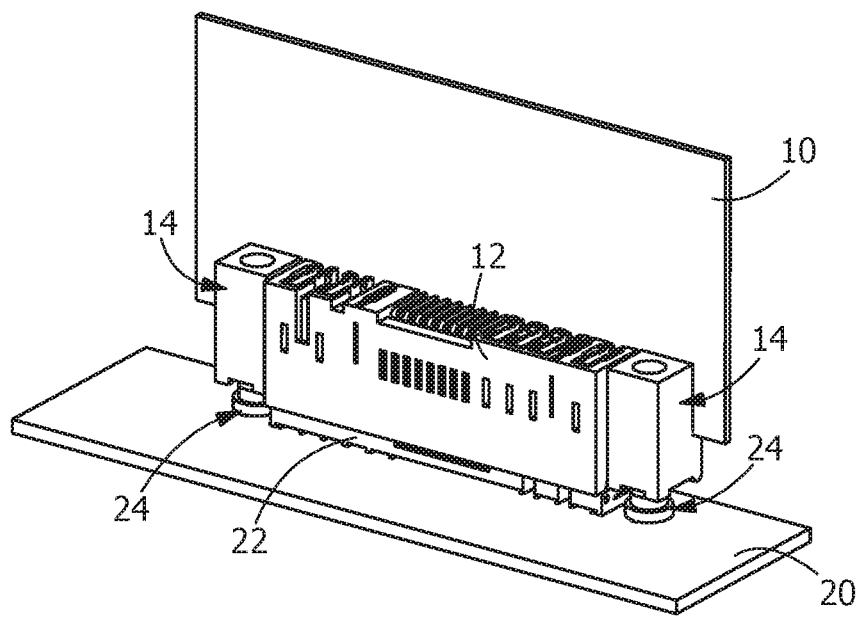
FIG. 2 is a perspective view of the mating connector of FIG. 1 mounted on the daughtercard mated with the connector mounted the a backplane, the guideposts extending from the backplane are in a retracted position.
Figure 13:
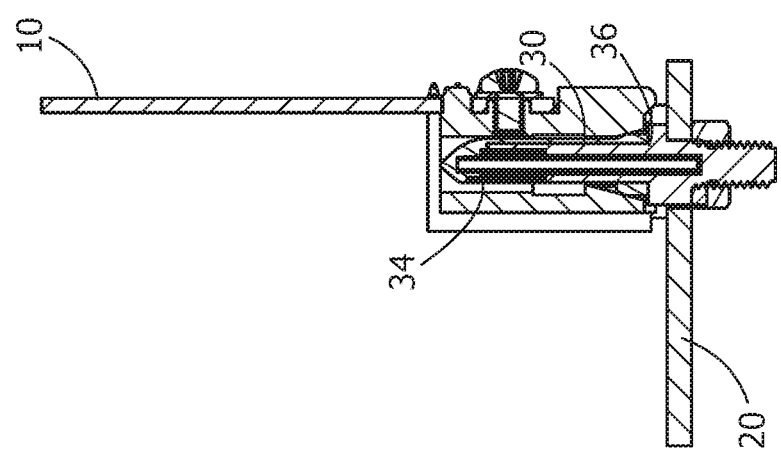
FIG. 13 is a cross-section view of the guidepost of FIG. 2 cooperating with the guidepost receptacle as the daughtercard is fully inserted onto the backplane.

With the guideposts 24 properly aligned with the guidepost receptacles 14, the daughtercard 10 is moved toward the backplane 20. As this occurs, the shoulders 48 of the guideposts 24 engage the tapered lead-in openings 86 of the guidepost receptacles 14. As the inside diameters D5 of the tapered lead-in openings 86 at the guidepost receiving opening 84 is smaller than the outside diameters D2 of the shoulders 48, the movement of the daughtercard 10 toward the backplane 20 causes the tapered lead-in openings 86 to engage the shoulders 48 and push the telescoping tip portions 30 toward the backplane 20. The movement of the daughtercard 10 toward the backplane 20 causes the springs 34 to compress. This continues until the first ends 80 of the guidepost receptacles 14 engage the backplane, as shown in FIGS. 2 and 13.

If the daughtercard 10 is removed from the backplane 20, the guidepost receptacles 14 are removed from the guideposts 24, thereby allowing the springs 34 to move toward their unstressed position, causing the telescoping tip portions 30 to return to the position shown in FIGS. 4 and 11.

Figure 6:
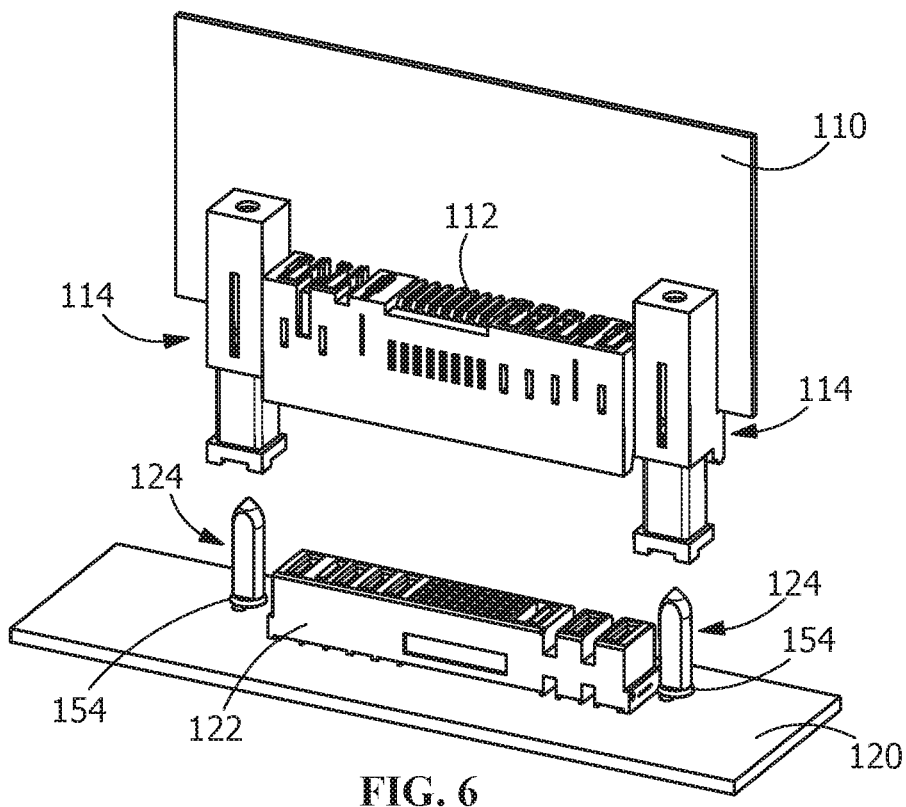
FIG. 6 is a perspective view of an alternate illustrative mating connector mounted on a daughtercard prior to mating with an alternate illustrative connector mounted on a backplane, guidepost receptacles extending from the daughtercard are shown in an extended position.

Referring to FIGS. 6 through 10, an alternate illustrative embodiment is shown. As shown in FIG. 6, a daughtercard 110 has a daughtercard connector 112 and guidepost receptacle 114 mounted thereon. A backplane 120 has a backplane connector 122 and guideposts 124 mounted thereon. The daughtercard 110 and backplane 120 are shown prior to being placed in electrical engagement in FIG. 6. The daughtercard 110 and backplane 120 are shown in electrical engagement in FIG. 7.

Figure 8:
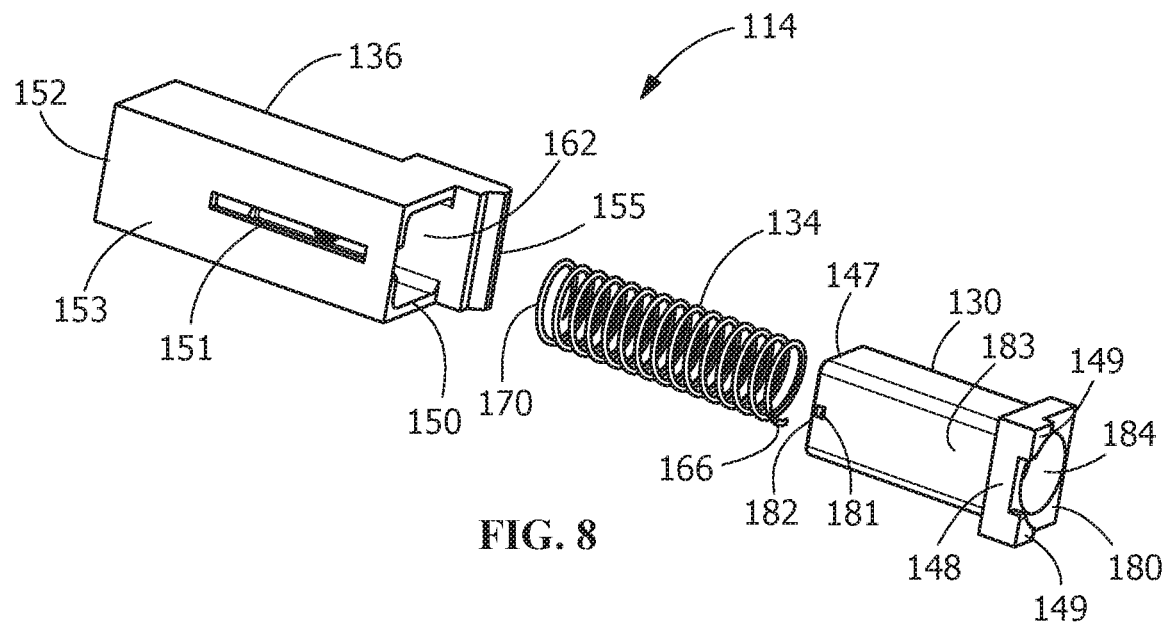
FIG. 8 is an exploded perspective view of an illustrative guidepost receptacle according the to the invention.

As shown in FIG. 8, each of the guidepost receptacles 114 has a telescoping receptacle portion 130, a coil spring 134 and a base 136. The telescoping receptacle portion 130 has a first end 180 and a second end 182. A guidepost receiving opening 184 extends from proximate the first end 180 toward the second end 182. An enlarged portion 148 is positioned proximate the first end 180. The enlarged portion 148 has guidepost engagement projections 149 which extend from the first end 180. A projection 181 extends from one or more sidewalls 183 of the telescoping receptacle portion 130. The projection 181 is positioned between the first end 180 and the second end 182.

The base 136 has an open first end 150 and an oppositely facing closed second end 152. A telescoping receptacle portion receiving cavity 162 extends from the first end 150 to proximate the second end 152. An opening or slot 151 is provided in one or more sidewalls 153 of the base 136. A circuit board engaging projection 155 extends from the first end 150 away from the second end 152.

The coil spring 134 is dimensioned to be received in the telescoping receptacle portion receiving cavity 162 of the base 136. The spring 134 is dimensioned to have a length which is approximately equal to or slightly larger than the length of the telescoping receptacle portion receiving cavity 162 when the guidepost receptacle 114 is in the extended position, as shown in FIG. 9.

Figure 9:
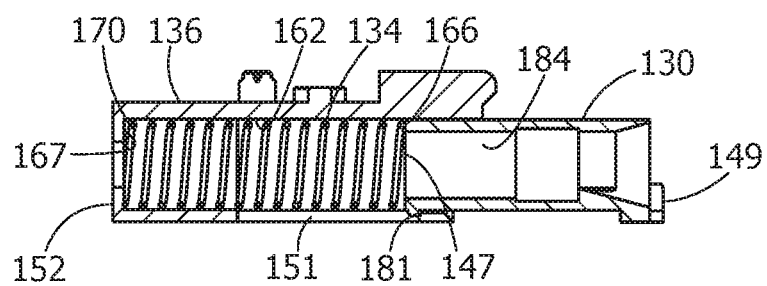
FIG. 9 is a cross-sectional view of the guidepost receptacle of FIG. 8 with a guidepost positioned therein, the guidepost receptacle is shown in the extended position. In this position, the daughtercard is not fully mated to the backplane.

In the extended position, shown in FIG. 9, the spring 134 is in the guidepost receiving opening 184 and the telescoping receptacle portion receiving cavity 162. A first end 166 of the spring 134 is in engagement with a spring cooperating shoulder 147 of the telescoping receptacle portion 130 and a second end 170 of the spring 134 is in engagement with the spring engaging surface 167 of the base 136. In this position, the spring 134 is slightly biased to keep the telescoping receptacle portion 130 extended until a force is applied to the telescoping receptacle portion 130.

In the extended position, a portion of the telescoping receptacle portion 130 proximate the second end 182 is positioned inside a portion of the first end 150 of the base 136, such that the second end 182 of the telescoping receptacle portion 130 is positioned in the telescoping receptacle portion receiving cavity 162 of the base 136. In this position, the projection 181 of the telescoping receptable portion 130 is positioned in the slot 151 of the base to prevent the removal of the telescoping receptacle portion 130 from the base 136.

Figure 10:
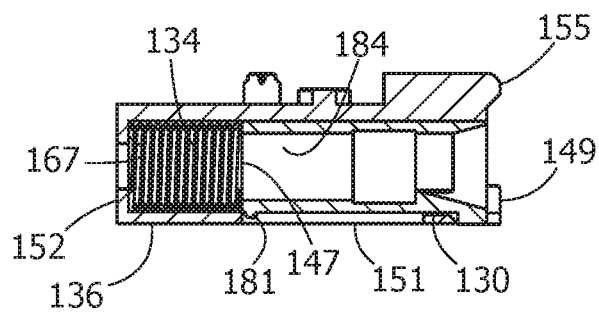
FIG. 10 is a cross-sectional view of the guidepost receptacle of FIG. 8 with a guidepost positioned thereon, the guidepost receptacle is shown in the retracted position. In this position, the daughtercard is fully mated to the backplane.

In the retracted or compressed position, shown in FIG. 10, the first end 166 of the spring 134 remains in engagement with the spring cooperating surface 147 of the telescoping receptacle portion 130 and the second end 170 of the spring 134 is in engagement with the spring engaging shoulder 167 of the base 136. In this position, the spring 134 is compressed and exerts a biasing force on the telescoping receptacle portion 130. In the retracted or compressed position, a majority of the telescoping receptacle portion 130 is positioned in telescoping receptacle portion receiving cavity 162 of the base 136.

In use, the daughtercard 110 and the guidepost receptacles 114 are moved into position relative to the backplane 120 and the guideposts 124. As the daughtercard 110 is mated to the backplane 120, the guidepost receiving openings 184 of the telescoping receptacle portion 130 of the guidepost receptacles 114 are moved onto the guideposts 124. The positioning of the guideposts 124 in the guidepost receiving openings 184 pulls the daughtercard 110 into more precise alignment with the backplane 120 into more precise alignment with the backplane 120 at a further distance D from the backplane 122 than known guideposts. The alignment allows the daughtercard connector 112 and the backplane connector 122 to be properly aligned, thereby facilitating mating of the daughtercard connector 112 to the backplane connector 122 and minimizing stubbing and damage to the connectors and the contacts housed in the connectors.

Figure 7:
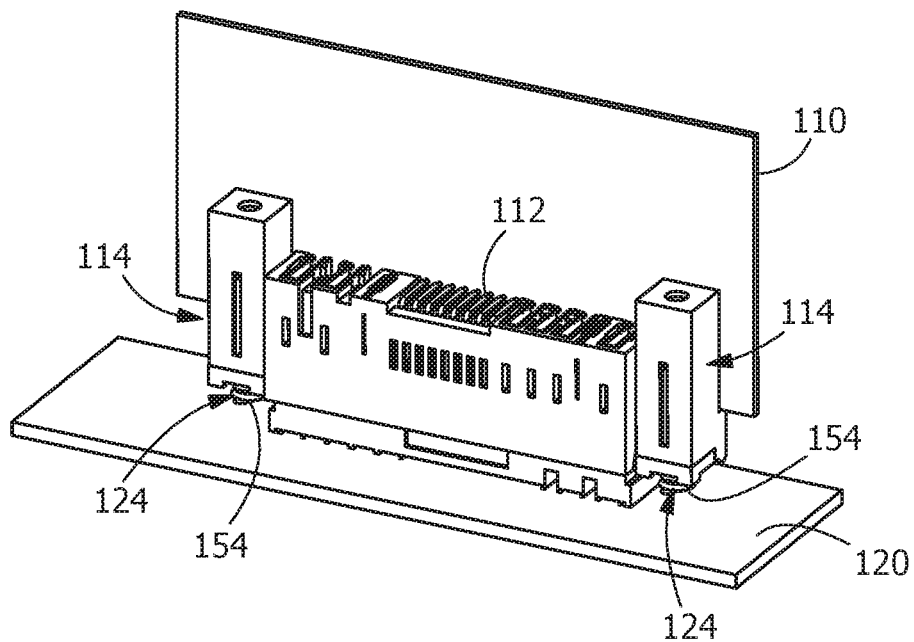
FIG. 7 is a perspective view of the mating connector of FIG. 6 mounted on the daughtercard mated with the connector mounted the a backplane, the guidepost receptacles extending from the daughtercard are in a retracted position.

With the guideposts 124 properly aligned with the guidepost receptacles 114, the daughtercard 110 is moved toward the backplane 120. As this occurs, the guidepost engagement projections 149 of the telescoping receptacle portions 130 engage a backplane positioning members 154 of the guideposts 124, thereby preventing further movement of the telescoping receptacle portions 130 toward the backplane 120. The continued movement of the daughtercard 110 toward the backplane 120 causes the telescoping receptacle portions 130 to move into the bases 136, causing the springs 134 to compress. This continues until the circuit board engagement projections 155 of the bases 136 engage the backplane, as shown in FIG. 7.

If the daughtercard 110 is removed from the backplane 120, the guidepost receptacles 114 are removed from the guideposts 124, thereby allowing the springs 134 to move toward their unstressed position, causing the telescoping receptacle portions 130 to return to the position shown in FIGS. 6 and 9.

While the invention has been described with reference to a preferred embodiment, it will be understood by those skilled in the art that various changes may be made and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. An alignment member for aligning a first electrical component to a second electrical component, the alignment member comprising:
   a base having a first spring receiving cavity which extends from a first end of the base to a spring engaging shoulder;
   a telescoping portion having a second spring receiving cavity with a spring cooperating surface, a center pin guide extending from proximate a closed end of the telescoping tip portion past an open end telescoping tip portion, the center pin guide extending along a longitudinal axis of the alignment member and being centered in the second spring receiving cavity; and
   a spring positioned in the first spring receiving cavity of the base and in the second spring receiving cavity of the telescoping portion, the spring has a length which is approximately equal to or slightly larger than the length of a cavity formed by the first spring receiving cavity and the second spring receiving cavity when the alignment member is in an extended position;
   wherein prior to mating with a mating alignment member, the spring is retained in a biased position to keep the telescoping portion extended until a force is applied to the telescoping portion by the mating alignment member.

2. The alignment member as recited in claim 1, wherein the alignment member is a guidepost.

3. The alignment member as recited in claim 2, wherein:
   the base has a tip receiving section with the first spring receiving cavity positioned therein, the first spring receiving cavity extends from the first end of the base to the spring engaging shoulder; and
   the telescoping portion has a closed end and an open end, the second spring receiving cavity extends from the open end to proximate the closed end, the spring cooperating surface provided proximate the closed end.

4. An alignment member for aligning a first electrical component to a second electrical component, the alignment member comprising:
   a base having a tip receiving section, the tip receiving section having a spring receiving cavity which extends from a first end of the base to a spring engaging shoulder;
   a telescoping tip portion having a closed end and an open end, a base receiving cavity extending from the open end to proximate the closed end, a spring cooperating surface provided proximate the closed end, a center pin guide extending from proximate the closed end of the telescoping tip portion past the open end telescoping tip portion, the center pin guide extending along a longitudinal axis of the alignment member and being centered in the base receiving cavity; and
   a spring positioned in the spring receiving cavity of the tip receiving section of the base and in the base receiving cavity of the telescoping tip portion, the spring has a length which is approximately equal to or slightly larger than the length of a cavity formed by the spring receiving cavity and the base receiving cavity when the alignment member is in an extended position;
   wherein prior to mating with a mating alignment member, the spring is retained in a biased position to keep the tip portion extended until a force is applied to the tip portion by the mating alignment member.

5. The alignment member as recited in claim 4, wherein the telescoping tip portion has a shoulder positioned proximate the open end of the telescoping tip portion, the shoulder extends about the circumference of the telescoping tip portion.

6. The alignment member as recited in claim 4, wherein the center pin guide is a cylindrical member with slots which extend along the length of the center pin guide, the slots form movable, resilient arms with retention shoulders provided proximate free ends of the resilient arms.

7. The alignment member as recited in claim 6, wherein a backplane positioning member is provided between the first end and the second end, a mounting hardware section extends from the backplane positioning member to the second end.

8. The alignment member as recited in claim 7, wherein a post receiving member is positioned in the spring receiving cavity, the post receiving member extends from proximate the first end to proximate the backplane positioning member, the post receiving member has a longitudinally extending opening to receive the center guide pin therein.

9. The alignment member as recited in claim 4, wherein the spring is retained in position between the spring engaging shoulder of the base and the spring cooperating surface of the telescoping tip portion.

10. The alignment member as recited in claim 9, wherein a center pin guide is positioned in a longitudinally extending center opening of the spring to properly center the spring in the spring receiving cavity and the base receiving cavity.

11. The alignment member as recited in claim 10, wherein in the extended position, the shoulder of an enlarged portion of the telescoping tip portion engages a shoulder of the base to prevent the removal of the telescoping tip portion from the base.

\* \* \* \* \*